(12) United States Patent
Weis

(10) Patent No.: US 8,759,939 B2
(45) Date of Patent: Jun. 24, 2014

(54) SEMICONDUCTOR ARRANGEMENT WITH ACTIVE DRIFT ZONE

(75) Inventor: Rolf Weis, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 98 days.

(21) Appl. No.: 13/362,033

(22) Filed: Jan. 31, 2012

(65) Prior Publication Data

US 2013/0193512 A1    Aug. 1, 2013

(51) Int. Cl.
*H01L 27/00* (2006.01)

(52) U.S. Cl.
USPC .................................. 257/499; 257/E27.033

(58) Field of Classification Search
USPC .................. 257/337, 339, 499, 529, E27.033, 257/E29.312
See application file for complete search history.

(56) References Cited

U.S. PATENT DOCUMENTS

| | | | |
|---|---|---|---|
| 5,237,193 | A | 8/1993 | Williams et al. |
| 5,557,127 | A | 9/1996 | Ajit et al. |
| 5,696,659 | A | 12/1997 | Maruo |
| 6,365,930 | B1 * | 4/2002 | Schillaci et al. ............... 257/339 |
| 2003/0071320 | A1 | 4/2003 | Kocon |
| 2010/0032671 | A1 | 2/2010 | Marshall |
| 2010/0102871 | A1 | 4/2010 | Werner |
| 2010/0301403 | A1 * | 12/2010 | Min et al. ...................... 257/316 |
| 2012/0175634 | A1 | 7/2012 | Weis |
| 2012/0175635 | A1 * | 7/2012 | Weis et al. ...................... 257/77 |
| 2013/0020635 | A1 | 1/2013 | Yilmaz et al. |

FOREIGN PATENT DOCUMENTS

| | | |
|---|---|---|
| DE | 102004041198 A1 | 3/2006 |
| DE | 102007013848 A1 | 9/2008 |
| EP | 1058318 A1 | 12/2000 |
| GB | 2318685 A | 4/1998 |
| WO | 2004107448 A1 | 12/2004 |
| WO | 2012093177 A2 | 7/2012 |

* cited by examiner

*Primary Examiner* — Thomas L Dickey
(74) *Attorney, Agent, or Firm* — Murphy, Bilak & Homiller, PLLC

(57) ABSTRACT

A semiconductor device arrangement includes a semiconductor layer and at least one series circuit with a first semiconductor device and a plurality of n second semiconductor devices, with n>1. The first semiconductor device has a load path and active device regions integrated in the semiconductor layer. Each second semiconductor device has active device regions integrated in the semiconductor layer and a load path between a first and second load terminal and a control terminal. The second semiconductor devices have their load paths connected in series and connected in series to the load path of the first semiconductor device. Each second semiconductor device has its control terminal connected to the load terminal of one of the other second semiconductor devices. One of the second semiconductor devices has its control terminal connected to one of the load terminals of the first semiconductor device. The arrangement further includes an edge termination structure.

28 Claims, 9 Drawing Sheets

SEMICONDUCTOR ARRANGEMENT WITH ACTIVE DRIFT ZONE

TECHNICAL FIELD

Embodiments of the present invention relate to a semiconductor arrangement, particularly a semiconductor arrangement with a first semiconductor device and with a plurality of second semiconductor devices connected in series.

BACKGROUND

One important aim in the development of power semiconductor devices, such as power transistors or power diodes, is to produce devices with a high voltage blocking capability but, nevertheless, a low on-resistance ($R_{ON}$), and with low switching losses.

Power transistors usually include a drift region arranged between a body region and a drain region and doped lower than the drain region. The on-resistance of a conventional power transistor is dependent on the length of the drift region in a current flow direction and on the doping concentration of the drift region, wherein the on-resistance decreases when the length of the drift region is reduced or when the doping concentration in the drift region is increased. However, reducing the length of the region or increasing the doping concentration reduces the voltage blocking capability.

One possible way to reduce the on-resistance of a power transistor having a given voltage blocking capability is to provide compensation regions in the drift region, wherein the compensation regions are doped complementary to the drift region. Another possible way is to provide field plates in the drift region which are dielectrically insulated from the drift region and which are, for example, connected to a gate or source terminal of the transistor. In these types of power transistors, the compensation zones or the field plates partly "compensate" doping charges in the drift region when the component is in its off-state. This allows to provide a higher doping of the drift region—which reduces the on-resistance—without reducing the voltage blocking capability.

A power diode (pin diode) usually includes a low doped drift or base region between a first emitter region of a first doping type and a second emitter region of a second doping type. A power diode is configured to block when a voltage with a first polarity (blocking voltage) is applied between the first and second emitter regions, and is configured to conduct a current when a voltage with a second polarity is applied between the first and second emitter regions. In the conducting state, however, a charge carrier plasma with charge carriers of the first and second type (p-type and n-type charge carriers) is generated in the base region. The amount of charge carrier plasma stored in the base region is dependent on a length of the base region and is, therefore, dependent on the voltage blocking capability, where the amount of charge carrier plasma increases when the voltage blocking capability increases. This charge carrier plasma has to be removed before the diode may block upon applying a blocking voltage.

These known devices, however, have a high output capacitance which may result in a time delay when the device changes the operation state from an on-state to an off-state and vice versa. There is, therefore a need to provide a power semiconductor device with a high voltage blocking capability, a low on-resistance and a low output capacitance.

SUMMARY

A first embodiment of the invention relates to a semiconductor device arrangement. The semiconductor device arrangement includes a semiconductor layer, and, at least one series circuit with a first semiconductor device and with a plurality of n second semiconductor devices, with n>1. The first semiconductor device has a load path and has active device regions integrated in the semiconductor layer, each of the second semiconductor devices has active device regions integrated in the semiconductor layer and has a load path between a first and a second load terminal and a control terminal, the second semiconductor devices have their load paths connected in series and connected in series to the load path of the first semiconductor device, each of the second semiconductor devices has its control terminal connected to the load terminal of one of the other second semiconductor devices, and one of the second semiconductor devices has its control terminal connected to one of the load terminals of the first semiconductor device. The semiconductor device arrangement further includes an edge termination structure.

Those skilled in the art will recognize additional features and advantages upon reading the following detailed description, and upon viewing the accompanying drawings.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 15 that includes

FIG. 16 that includes

FIG. 21 that includes

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figures 1, 3:
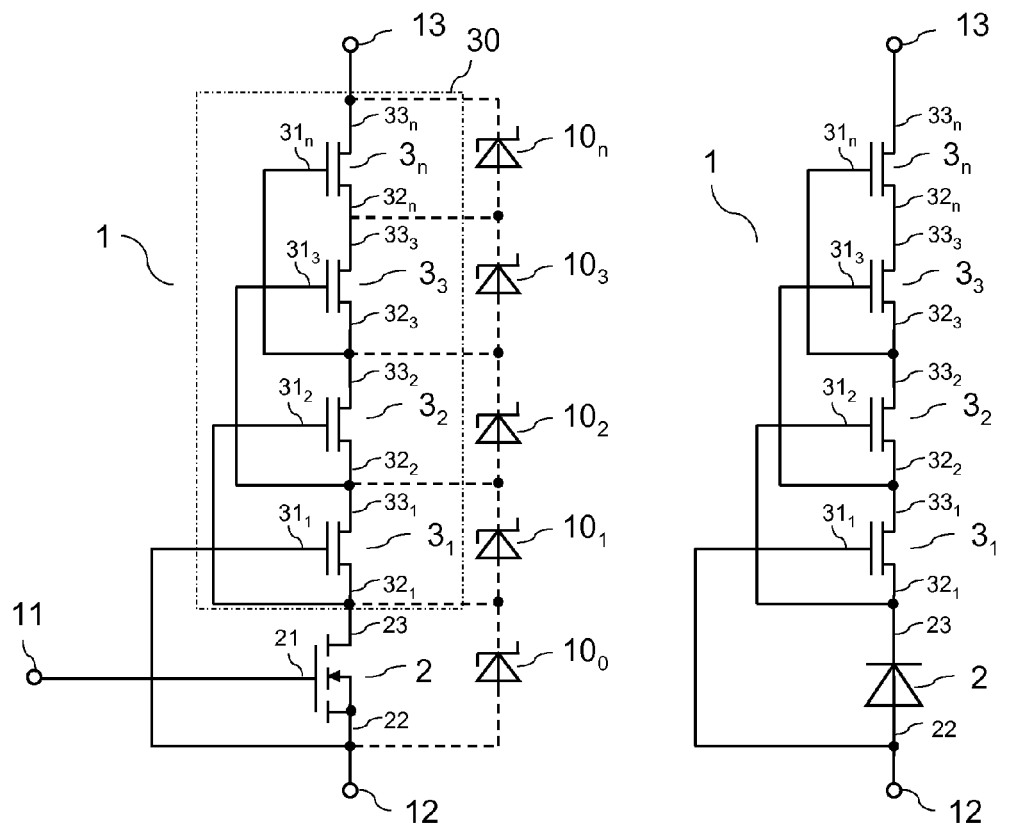
FIG. 1 illustrates a semiconductor arrangement with a first semiconductor device implemented as a transistor and with a plurality of second semiconductor devices connected in series with each other and connected in series with the first semiconductor device.
FIG. 3 illustrates a semiconductor arrangement with a first semiconductor device implemented as a diode and with a plurality of second semiconductor devices connected in series with each other and connected in series with the first semiconductor device.

FIG. 1 illustrates a first embodiment of a semiconductor arrangement 1 that includes a first semiconductor device 2 and a plurality of second semiconductor devices $3_1$-$3_n$. The first semiconductor device 2 has a load path between a first load terminal 22 and a second load terminal 23 and can assume an on-state, in which the load path conducts a current, or an off-state, in which the load paths blocks. The first semiconductor device 2 according to FIG. 1 is implemented as a transistor and further includes a control terminal 21. Specifically, the first semiconductor device 2 according to FIG. 1 is implemented as a MOSFET where the control terminal 21 is a gate terminal and the first and second load terminals 22, 23 are source and drain terminals, respectively.

In FIG. 1 as well as in the following figures reference number "3" followed by a subscript index denotes the individual second semiconductor devices. Same parts of the individual second semiconductor devices, such as control terminals and load terminals, have the same reference character followed by a subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistors in the embodiment illustrated in FIG. 1 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of an adjacent second transistor. Further, the load paths of the second transistors 3 are connected in series with the load path 22-23 of the first semiconductor device 2, so that the first semiconductor device 2 and the plurality of second transistors 3 form a cascode-like circuit.

Referring to FIG. 1, there are n second transistors 3, with n>1. From these n second transistors 3, a first one of the second transistors $3_1$ is the second transistor that is arranged closest to first semiconductor device 2 in the series circuit with the n second transistors 3 and has its load path $32_1$-$33_1$ directly connected to the load path 22-23 of the first semiconductor device 2. An n-th one of the second transistors $3_n$ is the second transistor that is arranged most distant to first semiconductor device 2 in the series circuit with the n second transistors 3. In the embodiment illustrated in FIG. 1, there are n=4 second transistors 3. However, this is only an example, the number n of second transistors 3 can be selected arbitrarily, namely dependent on a desired voltage blocking capability of the semiconductor device arrangement 1. This is explained in greater detail herein below.

Each of the second semiconductor devices 3 has its control terminal 31 connected to one of the load terminals of another one of the second semiconductor devices 3 or to one of the load terminals of the first semiconductor device 2. In the embodiment illustrated in FIG. 1, the 1st second transistor $3_1$ has its control terminal $31_1$ connected to the first load terminal 22 of the first semiconductor device 2. Each of the other second transistors $3_2$-$3_n$ have their control terminal $31_2$-$31_n$ connected to the first load terminal $32_1$-$32_{n-1}$ of the second transistor that is adjacent in the series circuit in the direction of the first semiconductor device 2. Assume, for explanation purposes, that $3_i$ is one of the second transistors $3_2$-$3_n$ other than the first transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ to which the control terminal $31_i$ of the upper second transistor $3_i$ is connected to is not directly connected to one of the load terminals $23_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal $31_i$ of the second transistor $3_i$ is connected to the first load terminal $32_{i-2}$ of the second transistor $3_{i-2}$ that is two second transistors away from the second transistor $3_i$ in the direction of the first semiconductor device 2 in the series circuit.

Referring to FIG. 1, the first semiconductor device 2 and the second transistors 3 can be implemented as MOSFETs (metal-oxide-semiconductor field-effect transistors). Each of these MOSFETs has a gate terminal as a control terminal 21, 31, a source terminal as a first load terminal, and a drain terminal as a second load terminal 22, 32. MOSFETs are voltage controlled devices that can be controlled by the voltage applied between the gate and source terminals (the control terminal and the first load terminal). Thus, in the arrangement illustrated in FIG. 1, the 1st second transistors $3_1$ is controlled through a voltage that corresponds to the load path voltage of the first semiconductor device 2, and the other second transistors $3_i$ are controlled through the load path voltage of at least one second transistor $3_{i-1}$ or $3_{i-2}$. The "load path" voltage of one MOSFET is the voltage between the first and second load terminals (drain and source terminal) of this MOSFET.

In the embodiment illustrated in FIG. 1, the first semiconductor device 2 is a normally-off (enhancement) transistor, while the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors.

Implementing the first semiconductor device 2 and the second transistors 3 as MOSFETs is only an example. Any type of transistor can be used to implement the first semiconductor device 2 and the second transistors 3, such as a MOSFET, a MISFET (metal-insulator-semiconductor field-effect transistor), a MESFET (metal semiconductor field effect transistor), an IGBT (insulated gate bipolar transistor), a JFET (junction gate field-effect transistor), a FINFET (fin FET), a nanotube device, an HEMT (high electron mobility transistor), etc. Independent of the type of device used to implement the first semiconductor device 2 and the second semiconductor devices 3, these devices are connected such that each of the second transistors 3 is controlled by the load path voltage of at least one other second transistor 3 or the first semiconductor device 2 in the series circuit.

The semiconductor device arrangement 1 with the first semiconductor device 2, implemented as transistor, and the second transistors 3 can be switched on and off like a conventional transistor by applying a suitable drive voltage to the first semiconductor device 2. The control terminal 21 of the first semiconductor device 2 forms a control terminal 11 of the overall arrangement 1, and the first load terminal 21 of the first semiconductor device 2 and the second load terminal of the n-th second transistor $3_n$ form the first and second load terminals 12, 13, respectively, of the overall arrangement 1.

Figure 2:
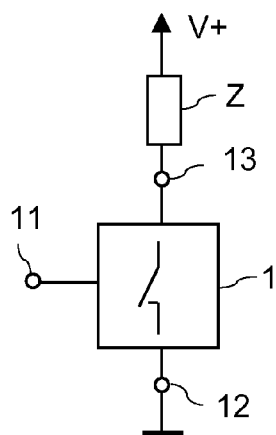
FIG. 2 illustrates the application of a semiconductor arrangement of FIG. 1 as an electronic switch for switching a load.

FIG. 2 illustrates the use of the semiconductor device arrangement 1 as an electronic switch for switching a load Z. The load path of the semiconductor arrangement 1, which is path between the first and second load terminals 12, 13 is connected in series with the load. The series circuit with the semiconductor device arrangement 1 and the load Z is connected between terminals for a first (positive) and a second (negative) supply potential V+, GND.

The operating principle of the semiconductor arrangement 1 is explained in the following. For explanation purposes only it is assumed that the first semiconductor device 2 is implemented as an n-type enhancement MOSFET, that the second transistors 3 are implemented as n-type depletion MOSFETs or n-type JFETs, and that the individual devices 2, 3 are interconnected as illustrated in FIG. 1. The basic operating principle, however, also applies to semiconductor device arrangements implemented with other types of first and second semiconductor devices.

It is commonly known that depletion MOSFETs or JFETs, that can be used to implement the second transistors 3, are semiconductor devices that are in an on-state when a drive voltage (gate-source voltage) of about zero is applied, while MOSFETs or JFETs are in an off-state when the absolute value of the drive voltage is higher than a pinch-off voltage of the device. The "drive voltage" is the voltage between the gate terminal and the source terminal of the device. In an n-type MOSFET or JFET the pinch-off voltage is a negative voltage, while the pinch-off voltage is a positive voltage in a p-type MOSFET or JFET.

When a (positive) voltage is applied between the second and first load terminals 13, 12 and when the first semiconductor device 2 is switched on by applying a suitable drive potential to the control terminal 11, the 1st second transistor $3_1$ is conducting (in an on-state), the absolute value of the voltage across the load path 22-23 of the first semiconductor device 2 is too low so as to pinch-off the 1st second transistor $3_1$. Consequently, the 2nd transistor $3_2$ controlled by the load path voltage of the 1st second transistor $3_1$ is also starting to conduct, etc. In other words, the first semiconductor device 2 and each of the second transistors 3 are finally conducting so that the semiconductor arrangement 1 is in an on-state. When the semiconductor arrangement 1 is in an on-state and when the semiconductor device 2 is switched off, the voltage drop across the load path of the first semiconductor device 2 increases, so that the 1st second transistor $3_1$ starts to switch off when the absolute value of the load-path voltage of the first semiconductor device 2 reaches the pinch-off voltage of the 1st of the second transistors 3. When a positive voltage is applied between the second load terminal 13 and the first load terminal 12 of the overall arrangement 1, the voltage between the second load terminal 23 and the first load terminal 22 of the first semiconductor device 2 is also a positive voltage when the first semiconductor device 2 switches off. In this case, the gate-source voltage of the 1st second transistor $3_1$ is a negative voltage suitable to pinch this transistor $3_1$ off.

When the 1st second transistor $3_1$ is switched off, the voltage drop across its load path increases so that the 2nd second transistor $3_2$ is switched off, which in turn switches off the 3rd second transistor $3_3$, and so on, until each of the second transistors 3 is switched off and the semiconductor device arrangement 1 is finally in a stable off-state. The external voltage applied between the second and first terminals 13 and 12 switches as many of the second transistors from the on-state to the off-state as required to distribute the external voltage over the first semiconductor device 2 and the second transistors 3. When applying a low external voltage, some second transistors 3 are still in the on-state, while others are in the off-state. The number of second transistors 3 that are in the off-state increases as the external voltage increases. Thus, when a high external voltage is applied, that is in the range of the voltage blocking capability of the overall semiconductor device arrangement 1, the first semiconductor device 2 and each of the second transistors are in the off-state.

When the semiconductor device arrangement 1 is in an off-state and when the first semiconductor device 2 is switched on, the voltage drop across the load path of the first semiconductor device 2 decreases so that it switches on the 1st second transistor $3_1$, which in turn switches on the 2nd second transistor $3_2$, and so on. This continues until each of the second transistors 3 is again switched on.

The switching states of the second transistors 3 connected in series with the first semiconductor device 2 are dependent on the switching state of the first semiconductor device 2 and follow the switching state of the first semiconductor device 2. Thus, the switching state of the semiconductor arrangement 1 is defined by the switching state of the first semiconductor device 2. The semiconductor arrangement 1 is in an on-state when the first semiconductor device 2 is in an on-state, and the semiconductor arrangement 1 is in an off-state when the first semiconductor device 2 is in an off-state.

The semiconductor arrangement 1 has a low resistance between the first and second load terminals 12, 13 when it is in an on-state, and has a high resistance between the first and second load terminals 12, 13 when it is in an off-state. In the on-state, an ohmic resistance between the first and second load terminals 12, 13 corresponds to the sum of the on-resistances $R_{ON}$ of the first semiconductor device 2 and the second transistors 3. A voltage blocking capability, which is the maximum voltage that can be applied between the first and second load terminals 12, 13 when the semiconductor arrangement 1 is in an off-state before an avalanche breakthrough sets in, corresponds to the sum of the voltage blocking capabilities of the first semiconductor device 2 and the second transistors 3. The first semiconductor device 2 and the individual second transistors 3 may have relatively low voltage blocking capabilities, such as voltage blocking capabilities of between 3V and 50V. However, dependent on the number n of second transistors 3 a high overall voltage blocking capability of up to several 100V, such as 600V or more, can be obtained.

The voltage blocking capability and the on-resistance of the semiconductor arrangement 1 are defined by the voltage blocking capabilities of the first semiconductor device 2 and the second transistors 3 and by the on-resistances of the first semiconductor device 2 and the second transistors 3, respectively. When significantly more than two second transistors 3 are implemented (n>>2), m such as more than 5, more than 10, or even more than 20 second transistors 3 are implemented, the voltage blocking capability and the on-resistance of the semiconductor arrangement 1 are mainly defined by the arrangement 30 with the second transistors 3. The overall semiconductor arrangement 1 can be operated like a conventional power transistor, where in a conventional power transistor, an integrated drift region mainly defines the on-resistance and the voltage blocking capability. Thus, the arrangement 30 with the second transistors 3 has a function that is equivalent to the drift region in a conventional power transistor. The arrangement 30 with the second transistors 30 therefore is also referred to as active drift region (ADR) or active drift zone (ADZ). The overall semiconductor device arrangement 1 of FIG. 1 can be referred to as ADR transistor (ADZ transistor), or as ADRFET (ADZFET), when the first semiconductor device 2 is implemented as a MOSFET.

When the semiconductor device arrangement 1 is in an off-state, the voltage applied between the first and second load terminals 12, 13 is distributed such that a part of this voltage drops across the load path 22-23 of the first semiconductor device 2, while other parts of this voltage drop across the load paths of the second transistors 3. However, there may be cases in which there is no equal distribution of this voltage to the second transistors 3. Instead, those second transistors 3 that are closer to the first semiconductor device 2 may have a higher voltage load than those second transistors 3 that are more distant to the first semiconductor device 2.

In order to more equally distribute the voltage to the second transistors 3, the semiconductor arrangement 1 optionally includes voltage limiting means $10_1$-$10_n$ that are configured to limit or clamp the voltage across the load paths of the second transistors 3. Optionally, a clamping element $10_0$ is also connected in parallel to the load path (between the source and drain terminals) of the first semiconductor device 2. The voltage clamping means $10_0$-$10_n$ can be implemented in many different ways. For illustration purposes only the clamping means $10_0$-$10_n$ illustrated in FIG. 1 can include Zener diodes $10_0$-$10_n$, with each Zener diode $10_0$-$10_n$ being connected in parallel with the load path of one of the second transistors 3 and, optionally, the first semiconductor device 2.

Instead of the Zener diodes $10_0$-$10_n$, tunnel diodes, PIN diodes, avalanche diodes, or the like, may be used as well. According to a further embodiment (not illustrated), the individual clamping elements $10_0$-$10_n$ are implemented as transistors, such as, for example, p-type MOSFETs when the second transistors 3 are n-type MOSFETs. Each of these clamping MOSFETs has its gate terminal connected to its drain terminal, and the load path (the drain-source path) of each MOSFET is connected in parallel with the load path of one second transistor 3.

The individual clamping elements, such as the Zener diodes $10_0$-$10_n$ illustrated in FIG. 1 can be integrated in the same semiconductor layer or semiconductor body as the first semiconductor device 2 and the second transistors 3. However, these clamping elements could also be implemented as external devices arranged outside the semiconductor body.

FIG. 3 illustrates a further embodiment of a semiconductor device arrangement 1. In the arrangement of FIG. 3, the first semiconductor device 2 is implemented as a diode with an anode terminal forming the first load terminal 12 and a cathode terminal forming a second load terminal. The operating principle of the semiconductor arrangement 1 of FIG. 3 corresponds to the operating principle of the semiconductor arrangement 1 of FIG. 1 with the difference that an on-state (forward biased state) and an off-state (reverse biased) state of the diode cannot be controlled via a control terminal (like in the transistor according to FIG. 1) but is controlled by the polarity of the voltage applied between the second and first load terminals 23, 22. The semiconductor arrangement 1 of FIG. 3, when implemented with n-type depletion MOSFET or n-type JFET as the second transistors 3, is in an on-state when a positive voltage is applied between the first and second load terminals 13, 12 of the semiconductor arrangement 1, and the semiconductor arrangement 1 of FIG. 3 is in an off-state when a negative voltage is applied between the first and second load terminals 13, 12 of the semiconductor arrangement 1. Everything else that has been explained with reference to the semiconductor arrangement 1 of FIG. 1 applies to the semiconductor arrangement 1 with the diode 2 of FIG. 3 accordingly. The semiconductor arrangement 1 with the diode according to FIG. 3 can be used like a conventional (high voltage) diode.

In the following, when a differentiation between the first semiconductor device 2 and the second semiconductor devices (second transistors) 3 is not required, the first semiconductor device 2 and the second transistors 3 will simply be referred to as "devices". These devices 2, 3 are implemented in a common semiconductor body 100. This is schematically illustrated in FIG. 4.

Figure 4:
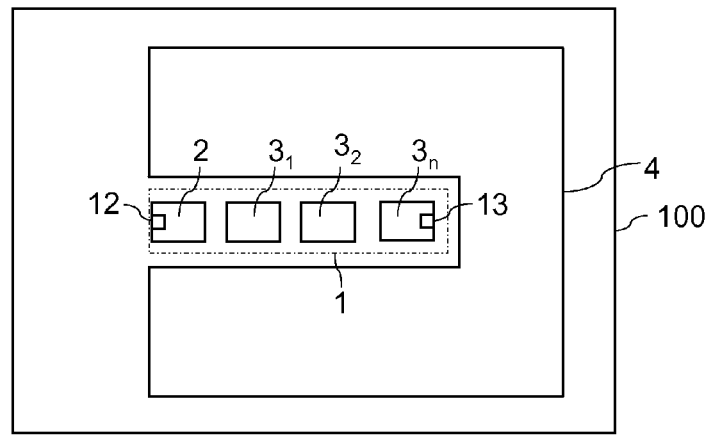
FIG. 4 schematically illustrates a top view on a semiconductor body in which a semiconductor arrangement according to a first embodiment with a first semiconductor device and with a plurality of second semiconductor devices is implemented.

FIG. 4 schematically illustrates a top view of a semiconductor layer or semiconductor body 100 in which active device regions, such as source and drain regions, of the first semiconductor device 2 and the second transistors 3 are integrated. The semiconductor layer 100 in which the active device regions are implemented can be part of a semiconductor body or may form a semiconductor body. According to a further embodiment, the semiconductor layer 100 is part of an SOI (silicon on insulator) substrate.

Regions of the semiconductor body 100 in which active device regions of these devices 2, 3 are integrated are schematically illustrated as rectangles. However, this is only example. The specific form of these regions is dependent on the implementation of the individual devices 2, 3. The active regions of the individual devices 2, 3 can be distant from one another or can be insulated from one another by insulation regions. The distance between the individual devices illustrated in FIG. 4 is not to scale. The active device regions of the individual devices are interconnected as illustrated in FIGS. 1 and 3. Connection lines that interconnect the individual devices can be implemented in a wiring arrangement above the semiconductor body 100 and are not illustrated in FIG. 4. The wiring arrangement can be implemented like a conventional wiring arrangement for interconnecting semiconductor devices in a semiconductor body and may include several metallization layers and vias. Such wiring arrangements are commonly known so that no further explanations are required in this regard.

Further, the first and second load terminals 12, 13 are schematically illustrated in FIG. 4. According to one embodiment, the second load terminal 13 is the drain terminal of the n-th second transistor $3_n$, and the first load terminal 12 is the anode terminal of the first semiconductor device 2 when implemented as a diode, or is the source terminal of the first semiconductor device 2 when implemented as a transistor.

The individual devices are basically in line, so that the first and second load terminals 12, 13 are distant in a lateral direction of the semiconductor body 100. When the semiconductor device arrangement 1 is in an off-state and when a voltage is applied between the load terminals 12, 13, the applied voltage drops across the series circuit with the individual devices 2, 3. Referring to the explanation provided before, the voltage blocking capability of the semiconductor device arrangement 1 is dependent on the voltage blocking capability of the individual devices 2, 3. Since the individual devices 2, 3 are implemented in one semiconductor body 100 there is not only a path for a voltage drop between the first and second load terminals 12, 13 through the series circuit with the individual devices 2, 3, but there is also an electrical field path between the first and second load terminals 12, 13 through those regions outside the active regions of the individual devices 2, 3 of the semiconductor device arrangement 1 of the semiconductor body 100 adjoining the regions in which active regions of the devices 2, 3 are implemented.

In these outside regions adjoining the active regions of the devices 2, 3 the semiconductor body 100 includes an edge termination 4 that is only schematically illustrated in FIG. 4. The edge termination 4 reaches from the first load terminal 12 (and the active device region it is connected to) to the second load terminal 13 (and the active device region it is connected to) along the series circuit with the individual devices 2, 3.

In the following, a direction in which the individual devices 2, 3 are in line will be referred to as longitudinal direction. The first semiconductor device 2 is located at a first longitudinal end of a structure with the active regions of the individual devices 2, 3, and the n-th transistor $3_n$ is located at a second longitudinal end. Referring to FIG. 4, the edge termination 4 may extend along both longitudinal sides of this structure and around the second longitudinal end.

Figure 5:
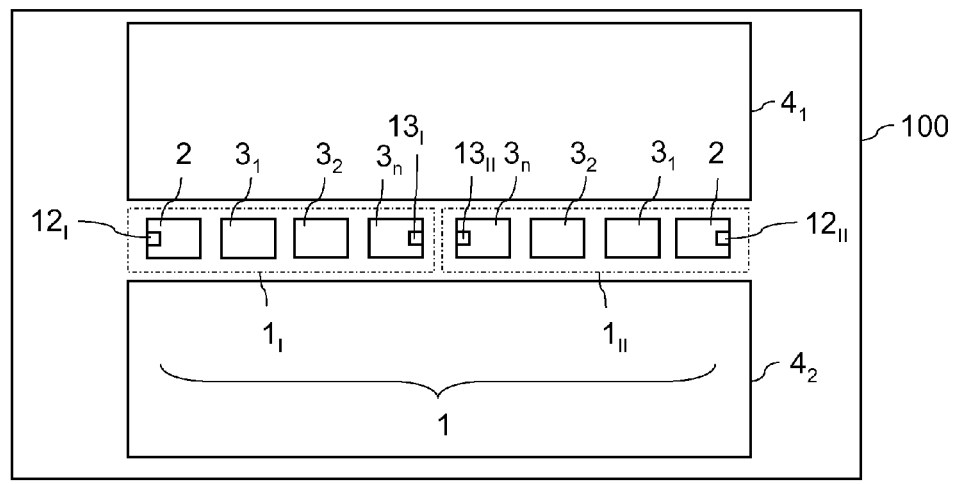
FIG. 5 schematically illustrates a top view on a semiconductor body in which a semiconductor arrangement according to a second embodiment with a first semiconductor device and with a plurality of second semiconductor devices is implemented.

FIG. 5 schematically illustrates a further embodiment of implementing a semiconductor device arrangement 1 with a first semiconductor device 2 and with a plurality of n second transistors 3 in a semiconductor body 100. In this embodiment, the semiconductor device arrangement 1 includes two series circuits $1_I$, $1_{II}$, with each series circuit including a first semiconductor device 2 and n second transistor $3_1 \ldots _n$. Further, each series circuit includes a first load terminal $12_I$, $12_{II}$ and a second load terminal $13_I$, $13_{II}$. According to one embodiment, the second load terminals $13_I$, $13_{II}$ are electrically connected, and the first load terminals $12_I$, $12_{II}$ are electrically connected, so that the two series circuits $1_I$, $1_{II}$ are connected in parallel. In operation of the semiconductor device arrangement 1 the voltage across each of the two series circuits $1_I$, $1_{II}$ are identical.

The active device regions of the individual devices 2, 3 are integrated in the semiconductor body 100 such that active device regions of the n-th transistors $3_n$ in the series circuits $1_I$, $1_{II}$ are adjacent and such that the second longitudinal ends (those ends where the n-th second transistors $3_n$ are located) of the structures with the active regions of the individual devices 2, 3 are adjacent, while the first longitudinal ends are distant in a lateral direction of the semiconductor body 100. In this embodiment, the edge termination structure includes a first partial structure $4_1$ arranged along one longitudinal side of the structure with the active regions of the individual devices 2, 3 and a second partial structure $4_2$ arranged along a second longitudinal side of the structure. The first and second partial structures $4_1$, $4_2$ are identical, but are axially symmetric relative to a line that is perpendicular to a line along which the active regions of the individual transistors 2, $3_1$-$3_n$ are arranged between the load terminals $12_I$, $12_{II}$, $13_I$, $13_{II}$, so that in the following only one of these partial structures is be explained in detail. Like the edge termination structure 4 illustrated in FIG. 4, the partial structures $4_1$, $4_2$ of FIG. 5 do not extend around the first longitudinal ends.

Figure 6:
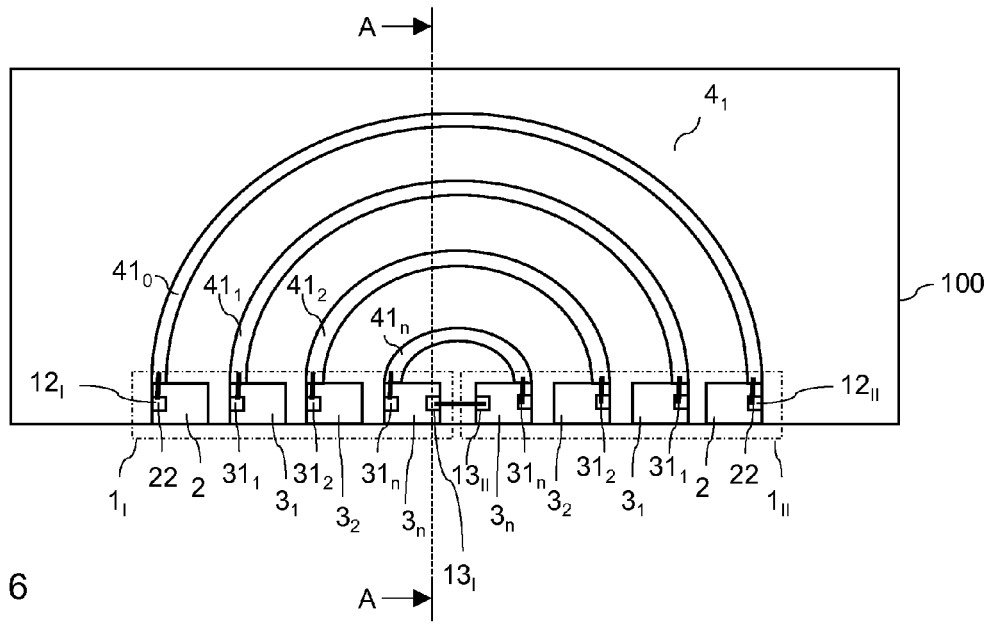
FIG. 6 illustrates a top view on an edge termination structure according to a first embodiment.

FIG. 6 schematically illustrates a first embodiment of one $4_1$ of the edge termination structures. FIG. 6 schematically illustrates a top view on the semiconductor body 100. Besides the edge termination structure $4_1$ those regions of the semiconductor body 100 in which active regions of the individual devices 2, 3 and the first load terminals 21, $31_1$, $31_2$, $31_n$ of the individual devices are schematically illustrated.

The semiconductor body 100 has a basic doping of one conductivity type at least in those regions in which the edge termination structure $4_1$ is implemented, or is intrinsic. In the figures, reference number 40 denotes those regions of the semiconductor body 100 that have the basic doping 40. According to one embodiment, the type of the basic doping is complementary to the conduction type of the second transistors 3. Thus, the semiconductor body 100 includes a p-type basic doping when the second transistors 3 are n-type transistors, and includes an n-type basic doping when the second transistors 3 are p-type transistors. The doping concentration of the basic doping is dependent on the desired voltage blocking capability of the device. The basic doping is equal or smaller than the doping concentrations used in drift regions of conventional MOSFETs, for example less than 1E15 cm$^{-3}$ for a 600V device.

The edge termination structure $4_1$ includes a plurality of field rings $41_0$-$41_n$ of a doping type complementary to the basic doping of the semiconductor body 100. In the embodiment illustrated in FIG. 6, these field rings are elliptical ring segments, in particular circular ring segments. However, the form of these field rings $41_0$-$41_n$ is not limited to elliptical ring segments. Other forms of these field rings, e.g., rectangular ring segments with rounded corners, can also be applied. In the embodiment illustrated in FIG. 6, each field ring $41_0$-$41_n$ starts adjacent to the active region of one device in the first series circuit 1, and ends adjacent to the active region of the corresponding device in the second series circuit $1_{II}$. "Corresponding devices" in the first and second series circuit $1_I$, $1_{II}$ are devices having the same order number, so that the first semiconductor device 2 in the first series circuit $1_I$ corresponds to the first semiconductor device 2 in the second series circuit $1_{II}$, the first transistor 3, in the first series circuit 1, corresponds to the first transistor $3_1$ in the second series circuit $1_{II}$, etc. According to one embodiment, each device 2, 3 has a field ring $41_0$-$41_n$ associated thereto, where corresponding devices in the first and second series circuits $1_I$, $1_{II}$ have one field ring in common. Each field ring is electrically connected to the first load terminal of the device it is associated to, so that in the embodiment illustrated in FIG. 6, each field ring $41_0$-$41_n$ is electrically connected to the first load terminal of two devices. According to a further embodiment (not illustrated), the field rings $41_1$-$41_n$ other than the outer field ring $41_0$ is connected to the first load terminal of only one device. The "outer field ring" $41_0$ is the field ring that is connected to the first load terminals 22 of the first semiconductor devices 2 in the first and second partial structures $1_I$, $1_{II}$.

The individual field rings $41_0$-$41_n$ are spaced and have different radii, with the field ring $41_0$ being associated with the first semiconductor device 2 having the largest radius, while the field ring is associated $41_n$ with the n-th transistor 3, having the smallest radius. The doped field rings $41_0$-$41_n$ can be implemented using conventional diffusion and/or implantation methods. The doping concentration of the field rings $41_0$-$41_n$ is optimized such that the electric field is below the critical electric field (3E5 V/cm in silicon) when applying the breakthrough voltage between the second and first terminals 12 and 13.

The region of the semiconductor body 100 outside the outer field ring $41_0$ can be connected to a terminal of the semiconductor device arrangement 1 that has the lowest electrical potential when the semiconductor device 1 is in operation, or can be connected to an external terminal that has this electrical potential. According to one embodiment, the region outside the outer field ring $41_0$ is connected to the first load terminal 22 of the first semiconductor device 2, or is connected to a ground terminal.

Figure 7:
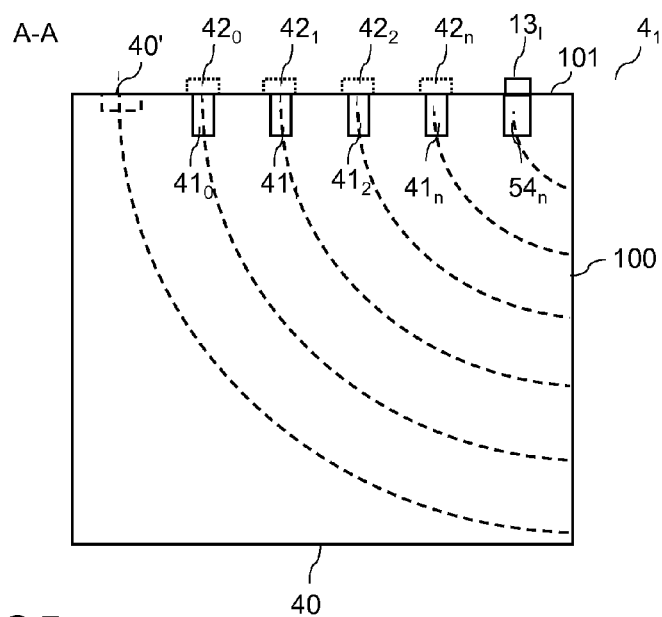
FIG. 7 illustrates a vertical cross sectional view of the edge termination structure of FIG. 6.

FIG. 7 schematically illustrates a vertical cross sectional view of the edge termination structure $4_1$ in a section plane A-A illustrated in FIG. 6. This section plane A-A cuts through the edge termination structure $4_1$ and through the second load terminal $13_1$ of the first series circuit $1_1$. In FIG. 7 reference character 54 denotes an active device region of the n-th transistor 3, to which the second load terminal $13_I$ is connected. According to one embodiment, this device region 54 is a drain region of the n-th transistor $3_n$. In FIG. 7, reference number 40' denotes an optional contact region for connecting the outer region of the semiconductor body 100 to the lowest electrical potential. This contact region 40' can be a doped region of the same doping type as the as the basic doping, but more highly doped. This contact region 40' can be implemented as a ring that surrounds the overall arrangement with the active device regions 2, 3 and the field rings $41_0$-$41_n$ in the horizontal plane of the semiconductor body 100.

The operating principle of the edge termination structure $4_1$ of FIG. 6 is explained in the following. For explanation purposes it is assumed that the second transistors 3 are n-type transistors and that the semiconductor body 100 has a p-type basic doping. Further, it is assumed that the voltages applied between the second terminals $13_I$, $13_{II}$ (that are electrically connected) and the first load terminals $12_I$, $12_{II}$ of the two series circuits $1_I$, $1_{II}$ are such that the second terminals $13_I$, $13_{II}$ have a higher electric potential than the first terminals $12_I$, $12_{II}$. Referring to the explanation herein before, each of the individual second transistors 3 takes a share of the overall voltage applied between the load terminals $13_I$, $13_{II}$, $12_I$, $12_{II}$, so that the first load terminals $31_1$, $31_2$, $31_n$ of the second transistors 3 and the first load terminal 21 of the first semiconductor device 2 have different electric potentials. Consequently, the field rings $41_0$-$41_n$ connected to the first load terminals have different electric potentials. Referring to FIG. 7, each field ring forms a diode with the surrounding and complementarily doped semiconductor regions 40. The voltage blocking capability of the edge termination structure $4_1$ is defined laterally by the potential steps from one ring to the next ring and vertically by the doping concentration of the basic doping 40 of the semiconductor body 100.

FIG. 7 also illustrates the equipotential lines of an electric field occurring in the semiconductor body 100 when applying a voltage between the load terminals $13_I$, $13_{II}$ $13_I$, $13_{II}$. The lowest potential occurs at the contact ring 40' that can be connected to ground or the lowest electrical potential occurring in the circuit, while the highest electrical potential occurs at the second load terminal $13_I$.

Optionally, electrically conducting lines $42_0$-$42_n$, such as metal lines or highly doped polysilicon lines, adjoin the field rings $41_0$-$41_n$ and are arranged above the first surface 101 of the semiconductor body 100. The shape of these electrical conducting lines $42_0$-$42_n$ in the horizontal plane corresponds to the shape of the field rings $41_0$-$41_n$, so that these electrically conducting lines $42_0$-$42_n$ have for example an elliptical or circular shape. The electrically conducting lines $42_0$-$42_n$ help to better electrically connect the first load terminals 21, $31_1$, $31_2$, $31_n$ of the individual devices 2, $3_1$, $3_2$, $3_n$ to the field rings $41_0$-$41_n$, so that there is no potential difference along one individual field ring. According to one embodiment, each of the individual field rings $41_1$-$41_n$ are connected to a device in only one of the partial structures $1_I$, $1_{II}$ and the corresponding field ring is connected to the device in the other partial structure $1_{II}$, $1_I$.

Figure 8:
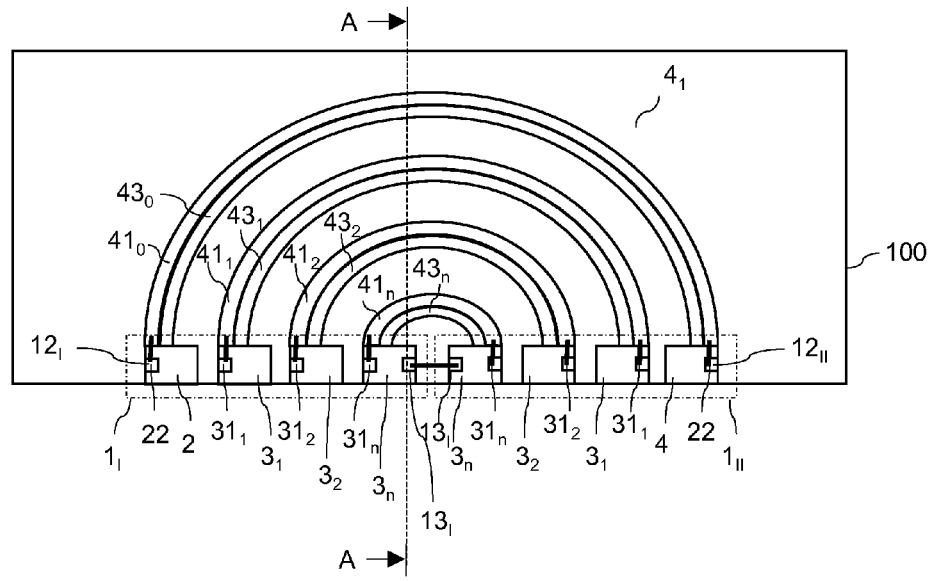
FIG. 8 illustrates a top view on an edge termination structure according to a second embodiment.
Figure 9:
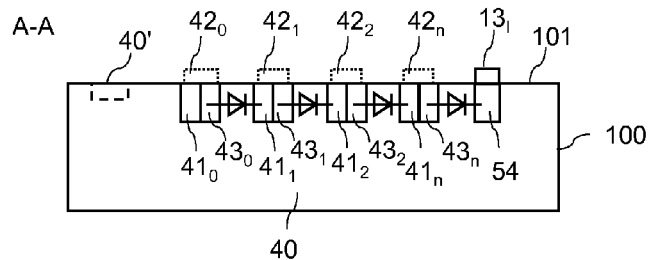
FIG. 9 illustrates a vertical cross sectional view of the edge termination structure of FIG. 8.

FIG. 8 illustrates a further embodiment of an edge termination structure $4_1$. The embodiment illustrated in FIG. 8 is based on the embodiment illustrated in FIG. 6, with the embodiment of FIG. 8 additionally comprising second field rings $43_0$-$43_n$ where the basic doping of the semiconductor body 100 is intrinsic. The doping concentration of the second rings $43_0$-$43_n$ can be high, e.g., at least 1E19 cm$^{-3}$. Each second field ring $43_0$-$43_n$ adjoins one of the field rings $41_0$-$41_n$ (which will be referred to as first field rings as the following). In the arrangement of FIG. 9, one first field ring 41, one second field ring 43 distant to the one first field ring and the semiconductor region having the basic doping between the one first field ring and the one second field ring form a p-i-n diode. Further, a p-i-n diode is formed between the second field ring 43, and an active device region 54, to which the second load terminal $13_I$ is connected to. According to one embodiment, this active device region 54, is the drain region of the n-th second transistor $54_n$. Thus, there is a p-i-n diode chain between the first load terminal $12_I$ and the second load terminal $13_I$. This diode chain defines the voltage blocking capability in the edge region.

Referring to FIG. 9 that schematically illustrates a vertical cross sectional field of the edge termination structure $4_1$, the edge termination structure $4_1$ optionally includes electrically conducting lines $42_0$-$42_n$, with each electrically conducting line electrically connecting one first field ring $41_0$-$41_n$ and the corresponding adjacent second field ring $43_0$-$43_n$. The operating principle of the edge termination structure $4_1$ of FIGS. 8 and 9 corresponds to the operating principle of the edge termination structure of FIGS. 6 and 7 with the difference that in the edge termination structure 4$_1$ according to FIGS. 8 and 9 avalanche or Zener diodes are formed between two neighboring pairs of field rings, with each "pair of field rings" including a first field ring and an adjoining second field ring. For example, first field ring 41$_0$ and second field ring 43$_0$ form a pair of field rings, and a Zener diode is formed between the second field ring 43$_0$ and the first field ring 41$_1$ of the neighboring pair of field rings 41$_1$, 43$_1$. These avalanche or Zener diodes can be used as the voltage limiting elements 10$_0$-10$_n$ illustrated in FIG. 1.

Figure 10:
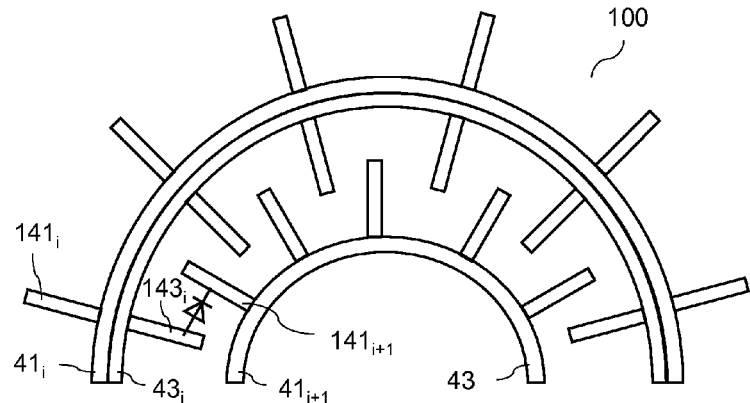
FIG. 10 illustrates a top view on an edge termination structure according to a third embodiment.

FIG. 10 schematically illustrates a further embodiment of implementing an edge termination structure with integrated Zener diodes or avalanche diodes. In FIG. 10, only two first field rings 41$_i$, 41$_{i+1}$ and one second field ring 43, adjoining the first field ring 41$_i$ are illustrated. Referring to FIG. 10, the individual first and second field rings each include a plurality of legs, with the legs of the first field rings 41$_i$, 41$_{i+1}$ extending radially outwardly, while the legs of the second field ring 43$_i$ extend radially inwardly. The legs of one second field ring, such as second field ring 43$_i$ of FIG. 10, and the legs of the neighboring and distant first field ring, such as field ring 41$_{i+1}$ of FIG. 10, are distant to each other and overlap in the radial direction, so that between one leg 143$_i$ of the second field ring 43, and one leg 141$_{i+1}$ of the first field ring 41$_{i+1}$ one avalanche diode or Zener diode is formed.

Any type of substrate, other than a simple semiconductor substrate can be used to accommodate the active device regions of the semiconductor devices 2, 3$_1$-3$_n$. According to one embodiment, the substrate is an SOI substrate. In this embodiment, the active device regions of the semiconductor devices 2, 3 are implemented in a semiconductor layer above an insulation layer, where the insulation layer is arranged on another semiconductor layer.

Figure 11:
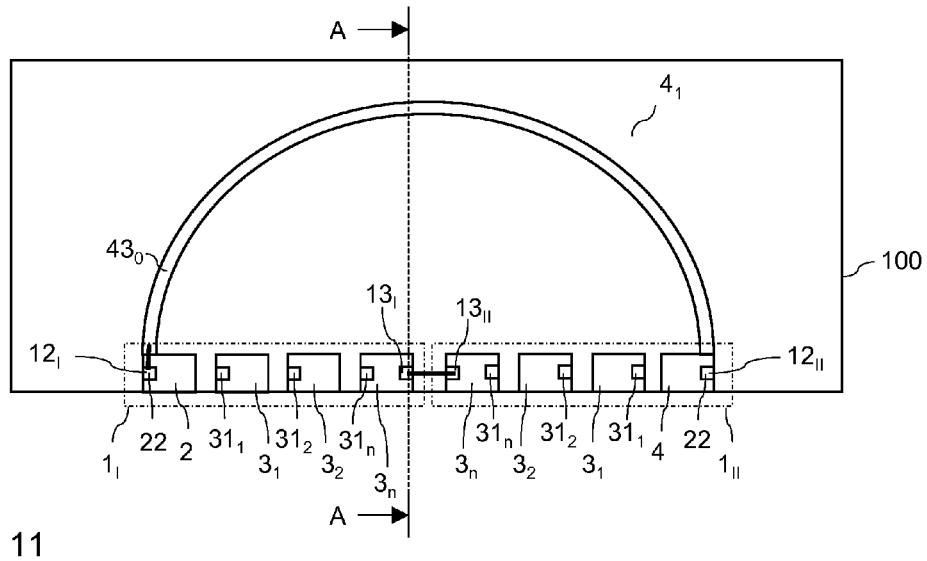
FIG. 11 illustrates a top view on an edge termination structure according to a fourth embodiment.

FIG. 11 illustrates a further embodiment of an edge termination structure 4$_1$. This edge termination structure 4$_1$ includes only one second field ring 43$_0$ of the doping type of the basic doping of the semiconductor body 100, but more highly doped than the basic doping, and connected to the first load terminals 12$_I$, 12$_{II}$.

Figure 12:
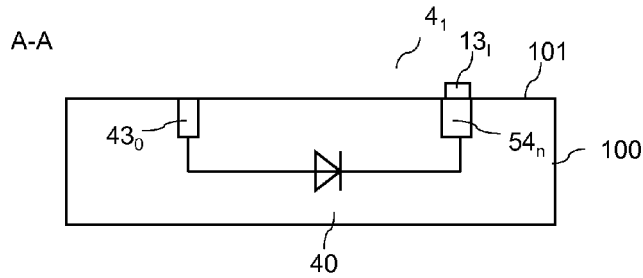
FIG. 12 illustrates a vertical cross sectional view of the edge termination structure of FIG. 11.

Referring to FIG. 12, which illustrates a vertical cross sectional view of the edge termination structure 4$_1$ of FIG. 11, a diode, e.g. a pn-diode or a p-i-n diode with an optional field ring 41$_0$ is formed between 43$_0$ and the active device region 54$_n$ to which the second load terminal 13$_I$ is connected.

The edge termination structure 4$_1$ illustrated in FIGS. 11 and 12 can be modified in many different ways e.g. as explained with reference to FIGS. 13 and 14 below.

Figure 13:
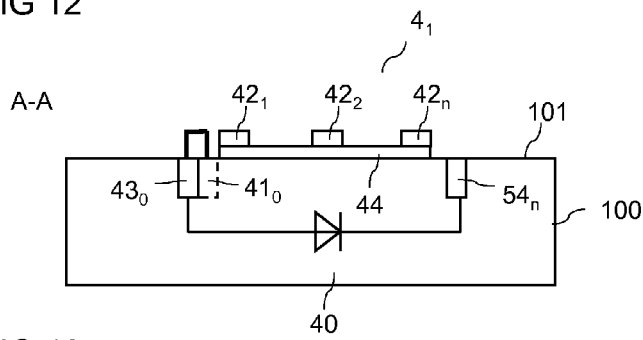
FIG. 13 illustrates a vertical cross sectional view of an edge termination structure according to a fifth embodiment.

Referring to FIG. 13, the edge termination structure 4$_1$ may include electrically conducting lines 42$_1$, 42$_2$, 42$_n$ arranged above the first surface 101 of the semiconductor body 100 and dielectrically insulated from the semiconductor body 100 by a dielectric layer 44. These electrically conducting lines 42$_1$, 42$_2$, 42$_n$ may correspond to the electrically conductive lines illustrated in FIGS. 7 and 9 and are connected to the first load terminals of the second transistors 3$_1$, 3$_2$, 3$_n$ (not illustrated in FIG. 13). These electrically conducting lines 42$_1$, 42$_2$, 42$_n$ can be, for example, elliptical or circular.

Additionally or alternatively to providing the electrically conducting lines 42$_1$, 42$_n$ the edge termination structure 4$_1$ may include a first field ring 41$_0$ of the opposite doping type as the basic doping of the semiconductor body 100, but more highly doped. This first field ring 41$_0$ adjoins the first field ring 43$_0$ radially inwardly. Further, the first and second field ring 41$_0$, 43$_0$ can be electrically connected through a connection line or connection electrode. Such connection line is schematically illustrated in bold lines in FIG. 13.

Figure 14:
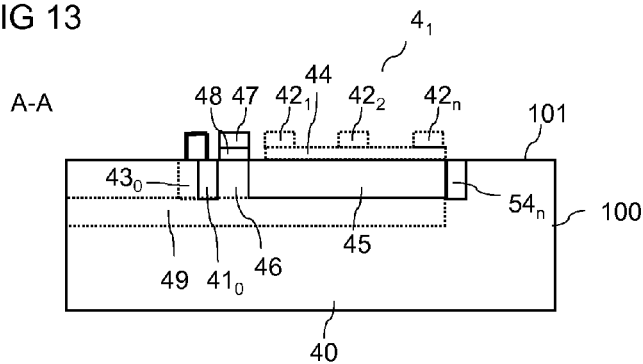
FIG. 14 illustrates a vertical cross sectional view of an edge termination structure according to a further embodiment.

FIG. 14 illustrates a further embodiment of an edge termination structure 4$_1$ that is based on the edge termination structure of FIG. 12. The edge termination structure 4$_1$ according to FIG. 14 includes a MOSFET between the first field ring 41$_0$ and the active device region 54$_n$. This MOSFET includes a drift region 45 of the same doping type as the first field ring 41$_0$ and the active device region 54$_n$, but more lowly doped, and a body region 46 of the same doping type as the basic doping of the semiconductor body 100. The doping concentration of the body region 46 may correspond to the basic doping of the semiconductor body 100. A gate electrode 47 is arranged adjacent the body region 46 and dielectrically insulated from the body region 46 by a gate dielectric 48. In the embodiment illustrated in FIG. 14, the gate electrode 47 is a planar gate electrode that is located above the first surface 101. However, this is only an example. This gate electrode 47 could also be implemented as a trench electrode in a trench of the semiconductor body 100. The body region 46 can be ring-shaped and adjoins the ring-shaped first field ring 41$_0$. This first field ring 41$_0$ forms a source region of the MOSFET, also referred to herein as edge MOSFET in the following. According to one embodiment, the gate electrode 47 is electrically connected to the control terminal of the first semiconductor device (not illustrated in FIG. 14).

Optionally, the edge termination structure 4$_1$ further includes the electrically conducting lines 42$_1$, 42$_2$, 42$_n$ explained with reference to FIG. 12. Further, a RESURF layer 49 of the same doping type as the basic doping of the semiconductor body 100 but more highly doped can be arranged below the drift region 45. Optionally, the first field ring 41$_0$ adjoins a second field ring 43$_0$ of the same doping type as the basic doping of the semiconductor body 100 but more highly doped.

The first semiconductor device 2 and the second transistors 3 that are represented by circuit symbols in FIGS. 1 and 3 and that are only schematically illustrated in FIGS. 4, 5, 6, 8 and 11 can be implemented in many different ways. Some illustrative embodiments for implementing the second transistors 3 are explained with reference to Figures below.

The edge termination structures explained with reference to FIGS. 6 to 14 can also be used in connection with the device structure of FIG. 4 in which the first semiconductor device 2 and the n-th second semiconductor device 3, are located on opposite ends of the (in line) structure with the individual active device regions. While in the embodiments according to FIGS. 6 to 14 the individual field rings are preferable elliptical or circular ring segments of about 180° and extend from one device in the first series circuit 1$_I$ to the corresponding device in the second series circuit 1$_{II}$, the field rings in the arrangement of FIG. 4 would be implemented with an angle of more than 180° such that each field ring extends from the active region of one device on one side of the in-line structure to the active region of the same device on the other side of the in-line structure and around the second longitudinal end.

In each of the edge termination structures explained before, the voltage blocking capability of the edge termination structure can be adjusted to correspond to the voltage blocking capability of the series circuit with the individual devices 2, 3, can be adjusted to be higher than the voltage blocking capability of the series circuit, or can be adjusted to be lower than the voltage blocking capability of the series circuit. Dependent on the voltage blocking capability of the edge termination structure 4 relative to the voltage blocking capability of the series circuit, the position of a voltage breakthrough when applying a voltage higher than the voltage blocking capability can be adjusted. The voltage breakthrough occurs in the edge termination structure 4, when the voltage blocking capability of the edge termination structure 4 is lower than the voltage blocking capability of the series circuit, and occurs in the series circuit, when the voltage blocking capability of the edge termination structure 4 is higher than the voltage blocking capability of the series circuit.

Figure 15A:
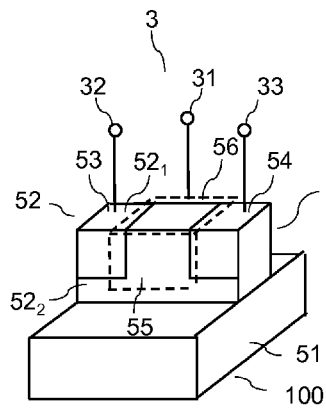
FIGS. 15A to 15C illustrates a first embodiment of one second semiconductor device implemented as a FINFET.
Figure 15B:
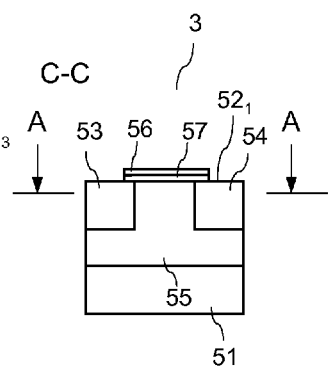
Figure 15C:
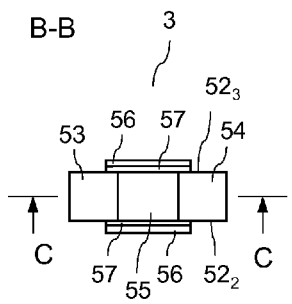

FIG. 15A shows a perspective view of one second transistor 3. FIG. 15B shows a vertical cross sectional view and FIG. 15C shows a horizontal cross sectional view of this second transistor 3. FIGS. 15A, 15B, 15C only show that section of the semiconductor body 100 in which the second transistor 3 is implemented. Active regions of the first semiconductor device 2 and active regions of neighbouring second transistors 3 are not shown. The second transistor 3 according to FIGS. 15A to 15C is implemented as a MOSFET, specifically as a FINFET, and includes a source region 53, a drain region 54 and a body region 55 that are each arranged in a fin-like semiconductor section 52, which will also be referred to as "semiconductor fin" in the following. The semiconductor fin 52 is arranged on a substrate 51. In a first horizontal direction, the source and drain regions 53, 54 extend from a first sidewall $52_2$ to a second sidewall $52_3$ of the semiconductor fin 52. In a second direction perpendicular to the first direction the source and drain regions 53, 54 are distant from one another and are separated by the body region 55. The gate electrode 56 (illustrated in dashed lines in FIG. 15A) is dielectrically insulated from the semiconductor fin 52 by a gate dielectric 57 and is adjacent to the body region 55 on the sidewalls $52_2$, $52_3$ and on a top surface $52_1$ of the semiconductor fin 52.

Figure 16A:
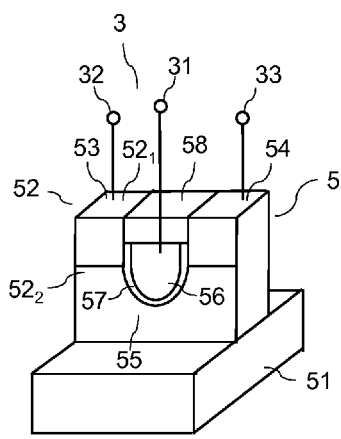
FIGS. 16A to 16C illustrates a second embodiment of one second semiconductor device implemented as a FINFET.
Figure 16B:
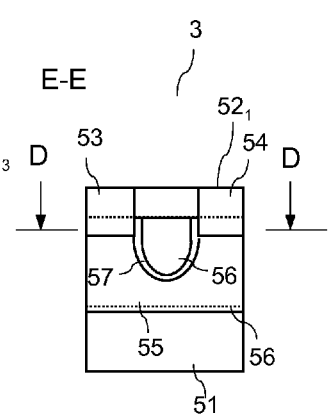
Figure 16C:
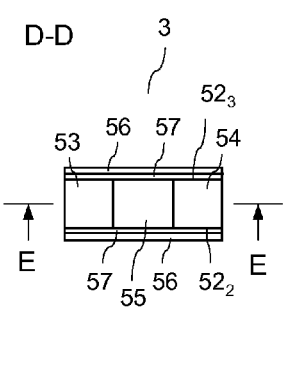

FIGS. 16A to 16C illustrate a further embodiment of one second transistor 3 implemented as a FINFET. FIG. 16A shows a perspective view, FIG. 16B shows a vertical cross sectional view in a vertical section plane E-E, and FIG. 16C shows a horizontal cross sectional view in horizontal section plane D-D. The vertical section plane E-E extends perpendicular to the top surface $52_1$ of the semiconductor fin 52 and in a longitudinal direction of the semiconductor fin 52. The horizontal section plane D-D extends parallel to the top surface $52_1$ of the semiconductor fin. The "longitudinal direction" of the semiconductor fin 52 corresponds to the second horizontal direction and is the direction in which the source and drain region 53, 54 are distant from one another.

The transistor 3 according to FIGS. 16A to 16C is implemented as a U-shape-surround-gate-FINFET. In this transistor, the source region 53 and the drain region 54 extend from the first sidewall $52_2$ to the second sidewall $52_3$ of the semiconductor fin 52 in the first horizontal direction, and are distant from one another in the second horizontal direction (the longitudinal direction of the semiconductor fin 52) that is perpendicular to the first horizontal direction. Referring to FIGS. 16A and 16B, the source region 53 and the drain region 54 are separated by a trench which extends into the body region 55 from the top surface $52_1$ of the semiconductor fin 52 and which extends from sidewall $52_2$ to sidewall $52_3$ in the first horizontal direction. The body region 55 is arranged below the source region 53, the drain region 54 and the trench in the semiconductor fin 52. The gate electrode 56 is adjacent to the body region 55 in the trench and along the sidewalls $52_2$, $52_3$ of the semiconductor fin 52 and is dielectrically insulated from the body region 55 and the source and drain regions 53, 54 by the gate dielectric 57. In an upper region of the trench, which is a region in which the gate electrode 56 is not arranged adjacent to the body region 55, the gate electrode 56 can be covered with an insulating or dielectric material 58.

The second transistors 3 of FIGS. 15A to 15C and of FIGS. 16A to 16C are, for example, implemented as depletion transistors, such as n-type or p-type depletion transistors. In this case, the source and drain regions 53, 54 and the body region 55 have the same doping type. The body region 55 usually has a lower doping concentration than the source and drain regions 53, 54. The doping concentration of the body region 55 is, e.g., about 2E18 cm$^{-3}$. In order to be able to completely interrupt a conducting channel in the body region 55 between the source region 53 and the drain region 54, the gate electrode 56 along the sidewalls $52_2$, $52_3$ of the semiconductor fin 52 completely extends along the semiconductor fin 52 in the second horizontal direction (the longitudinal direction). In the vertical direction the gate electrode 56 along the sidewalls $52_2$, $52_3$ extends from the source and drain regions 53, 54 to at least below the trench.

Referring to FIGS. 15A and 16A, the source region 53 is connected to the first load terminal (source terminal) 32, the drain region 54 is connected to the second load terminal (drain terminal) 33, and the gate electrode 56 is connected to the control terminal (gate terminal) 31. These terminals are only schematically illustrated in FIGS. 15A and 16A.

A thickness of the semiconductor fin 52, which is the dimension of the semiconductor fin in the first horizontal direction, and the doping concentration of the body region 55 are adjusted such that a depletion region controlled by the gate electrode 56 can extend from sidewall $52_2$ to sidewall $52_3$ in order to completely interrupt a conducting channel between the source and the drain region 53, 54 and to switch the second transistor 3 off. In an n-type depletion MOSFET a depletion region expands in the body region 55 when a negative control (drive) voltage is applied between the gate electrode 56 and the source region 53 or between the gate terminal 31 and the source terminal 32, respectively. Referring to the explanation provided with reference to FIG. 1, this drive voltage is dependent on the load voltage of the first semiconductor device 2, or is dependent on the load voltage of another one of the second transistors 3. How far the depletion region expands perpendicular to the sidewalls $52_2$, $52_3$ is also dependent on the magnitude of the control voltage applied between the gate terminal 31 and the source terminal 32. Thus, the thickness of the semiconductor fin 52 and the doping concentration of the body region 55 are also designed dependent on the magnitude of the control voltage that can occur during the operation of the semiconductor device arrangement 1.

Implementing the FINFETs illustrated in FIGS. 15A to 15C and 16A to 16C as a U-shape-surround-gate-FINFET, in which the channel (body region) 55 has a U-shape and the gate electrode 56 is also arranged on the sidewalls $52_2$, $52_3$ and on a top surface $52_1$ of the semiconductor fin 52 is only an example. These FINFETs could also be modified (not illustrated) to have the gate electrode 56 implemented with two gate electrode sections arranged on the sidewalls $52_2$, $52_3$ but not on the top surface $52_1$ of the semiconductor fin 52. A FINFET of this type can be referred to as double-gate FINFET. Each of the FINFETs explained above and below can be implemented as a U-shape-surround-gate-FINFET or as a double-gate FINFET. It is even possible to implement the individual second transistors 3 as different types of MOSFETs or FINFETs in one integrated circuit.

Each of the second transistors 3 and the first semiconductor device 2 can be implemented as a FINFET. These individual FINFETs can be implemented in different ways to form the semiconductor arrangement 1.

Figure 17:
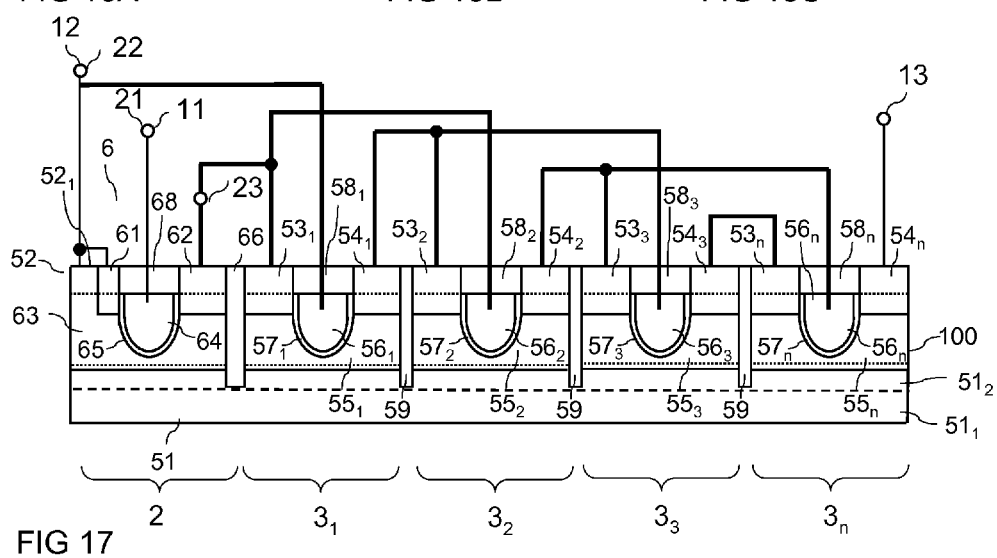
FIG. 17 illustrates a vertical cross sectional view of a semiconductor body according to a first embodiment in which a first semiconductor device and a plurality of second semiconductor devices are implemented in one semiconductor fin.

FIG. 17 illustrates a vertical cross sectional view of a semiconductor fin 52 in which active regions (source, drain and body regions) of a first semiconductor device 2 and of n second transistors 3 are arranged. In this embodiment, the first semiconductor device 2 and the second transistors 3 are implemented as U-shape-surround-gate FINFETs or as double-gate FINFETs. In FIG. 17, like reference numbers are used to denote like features as in FIGS. 15A to 15C and 16A to 16C. In FIG. 17 the reference numbers of like features of the different second transistors $3_1$-$3_n$ have different indices (1, 2, 3, n).

Referring to FIG. 17, the active regions of neighboring second transistors 3 are insulated from each other by dielectric layers 59 which extend in a vertical direction of the semiconductor fin 52. These dielectric layers 59 may extend down to or down into the substrate 51. Further, the dielectric layers 59 extend from sidewall to sidewall of the semiconductor fin 52. However, this is out of view in FIG. 17. The active regions of the first semiconductor device 2 are dielectrically insulated from active regions of the 1st second transistor $3_1$ by a further dielectric layer 66 that also extends in a vertical direction of the semiconductor fin 52. In the first semiconductor device 2, a source region 61 and a drain region 62 are separated by a body region 63. The gate electrode 64 that is arranged in the trench (and the position of which at the sidewalls of the semiconductor fin is illustrated by dotted lines), extends from the source region 61 along the body region 63 to the drain region 62. The source region 61 is connected the first load terminal 22 that forms the first load terminal 12 of the semiconductor arrangement 1, the drain region 62 is connected to the second load terminal 23, and the gate electrode 64 is connected to the control terminal 21 that forms the control terminal 11 of the semiconductor arrangement 1. The body region 63 is also connected to the first load terminal 22.

The first semiconductor device 2 is, for example, implemented as an enhancement MOSFET. In this case, the body region 63 is doped complementarily to the source and drain regions 61, 62. In an n-type MOSFET, the source and drain regions 61, 62 are n-doped while the body region 63 is p-doped, and in a p-type MOSFET, the source and drain regions 61, 62 are p-doped while the body region 63 is n-doped.

According to one embodiment, the substrate 51 is doped complementarily to the active regions of the second transistors 3 and to the source and drain regions 61, 62 of the first semiconductor device 2. In this case, there is a junction isolation between the individual second transistors 3. According to a further embodiment (illustrated in dashed lines), the substrate 51 is an SOI (silicon-on-insulator) substrate and includes a semiconductor substrate $51_1$ and an insulation layer $51_2$ on the semiconductor substrate $51_1$. The semiconductor fin 52 is arranged on the insulation layer $51_2$. In this embodiment, there is a dielectric layer between the individual second transistors 3 in the substrate 51.

Figure 18:
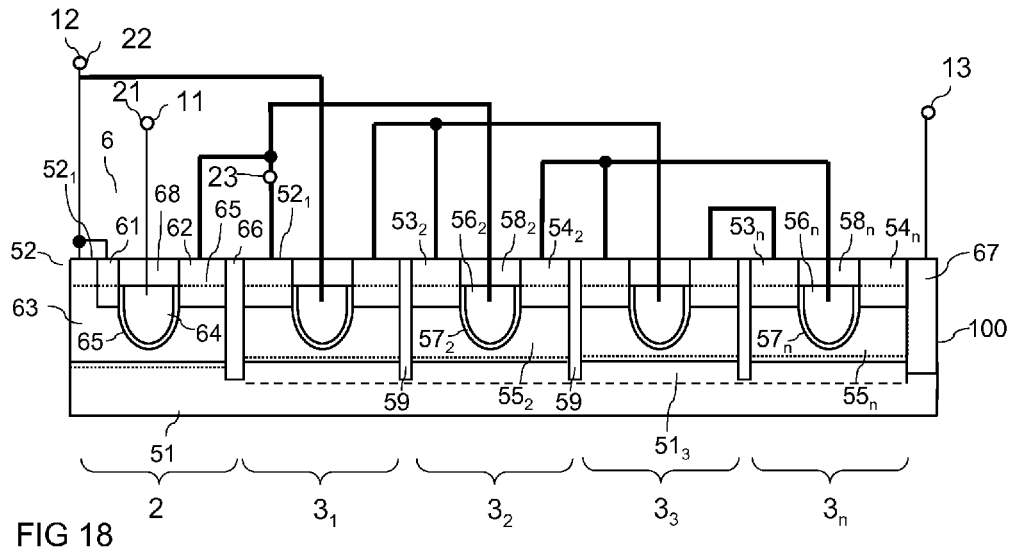
FIG. 18 illustrates a vertical cross sectional view of a semiconductor body according to a second embodiment in which a first semiconductor device and a plurality of second semiconductor devices are implemented in one semiconductor fin.

According to yet another embodiment, illustrated in FIG. 18, the substrate 51 has the same doping type as the active regions of the second transistors 3 and as the source and drain regions 61, 62 of the first semiconductor device 2. In this embodiment, the gate electrode 64 of the first semiconductor device 2 extends to the substrate 51, so that there is a conducting path in the body region 63 between the source region 61 and the substrate 51 when the first semiconductor device 2 is in the on-state. Further the substrate 51 is connected to the second load terminal 13 of the semiconductor arrangement 1 through a contact region 67 of the same doping type as the substrate 51. The contact region 67 is more highly doped than the substrate 51 and extends from the first surface $52_1$ of the semiconductor fin 52 to the substrate 51. The contact region 67 may adjoin the drain region $54_n$ of the n-th second transistor 3. The contact region 67 is optional. A connection between the second load terminal 13 and the substrate 51 could also be provided through the drain and body regions $54_n$, $55_n$ of the second transistor $3_n$.

In the semiconductor arrangement of FIG. 18, the substrate 51 forms a current path that is parallel to the current path through the second transistors 3 or that is parallel to the ADZ. The substrate 51 is similar to the drift region in a conventional power transistor. In this embodiment, the body regions 55 of the individual second transistors 3 are coupled to the drift region 51.

According to further embodiment (illustrated in dashed lines in FIG. 18) the substrate 51 includes a semiconductor layer $51_3$ doped complementary to remaining sections of the substrate 51 and to the body regions 55 of the second transistors 3. This layer $51_3$ is arranged between the body regions 55 of the second transistors 3 and those sections of the substrate 51 acting as a drift region and provides a junction insulation between the individual second transistors 3 in the substrate 51.

The semiconductor arrangement 1 of FIG. 3 with the diode 2 connected in series with the second transistors 3 can easily be obtained from the arrangements illustrated in FIGS. 15 and 16 by either connecting the control terminal of the first semiconductor device 2 to the first load terminal 22 or by letting the control terminal 21 float. In this case, only the body diode of the MOSFET, which is the diode formed by the pn-junction between the body region 63 and the drain region 65 is active between the first and second load terminals 22, 23 of the second semiconductor device 3.

Each of the first semiconductor device 2 and the second transistors 3 (referred to as devices in the following) may include a plurality of identical cells (transistor cells) that are connected in parallel. Each of these cells can be implemented like the first semiconductor device 2 or like the second transistors 3, respectively, illustrated in FIGS. 15 and 16. Providing a plurality of cells connected in parallel in one device can help to increase the current bearing capability and to reduce the on-resistance of the individual device.

Figure 19:
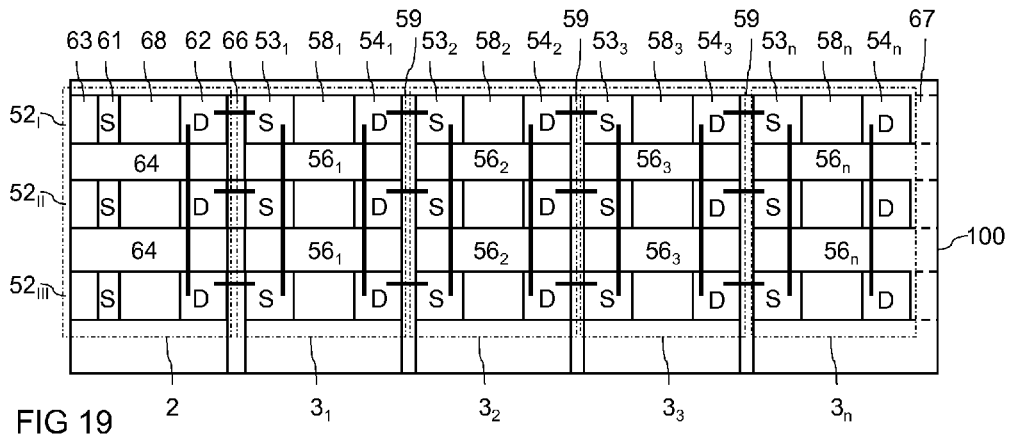
FIG. 19 illustrates a top view of a semiconductor body according to a third embodiment in which a first semiconductor device and a plurality of second semiconductor devices each including several FINFET cells are implemented.

FIG. 19 illustrates a top view of a semiconductor arrangement according to a first embodiment which includes a first semiconductor device 2 and a plurality of second transistors 3, with each of these devices having a plurality (from which three are illustrated) cells connected in parallel. The individual cells of one device are implemented in different semiconductor fins $52_I$, $52_{II}$, $52_{III}$. Each of these cells has a source region 61, 53 that is additionally labeled with "S" in FIG. 19, and a drain region 62, 54 that is additionally labeled with "D" in FIG. 19. The cells of one device are connected in parallel by having the source regions of the one device connected together and by having the drain regions of the one device connected together. These connections as well as connections between the load terminals of the different devices are schematically illustrated in bold lines in FIG. 19. Connections between the control terminals (gate terminals) and the load terminals of the different devices are not illustrated in FIG. 19. The connections between the cells and the different devices can be implemented using conventional wiring arrangements arranged above the semiconductor body and contacting the individual active regions (source and drain regions) through vias. Those wiring arrangements are commonly known so that no further explanations are required in this regard. The individual cells of one device 2, $3_1$, $3_2$, $3_3$, $3_n$ have a common gate electrode 64, $56_1$, $56_2$, $56_3$, $56_n$ arranged in the U-shaped trenches of the individual semiconductor fins and in trenches between the individual fins. These "trenches between the fins" are longitudinal trenches along the fins. All gates 64, 56₁, 56₂, 56₃, 56ₙ are electrically isolated from each other by a dielectric 66 and 59.

Figure 20:
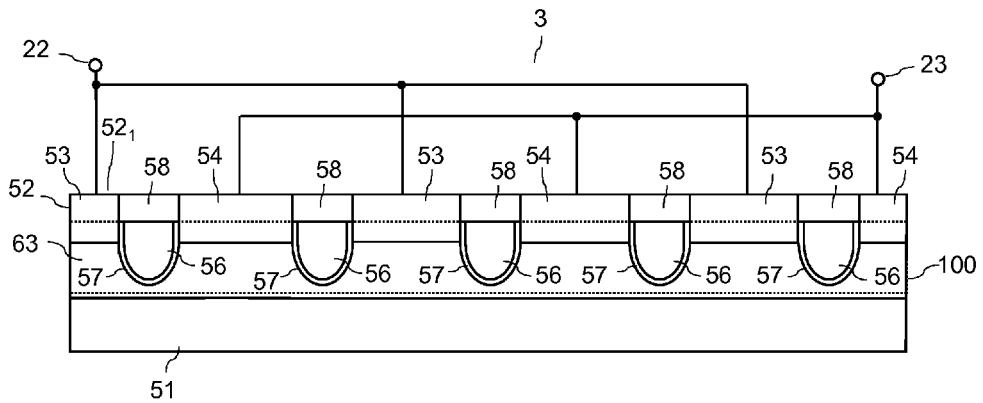
FIG. 20 illustrates a vertical cross sectional view of one second semiconductor device including several FINFET cells connected in parallel.

FIG. 20 illustrates a further embodiment for implementing one second transistor 3 with a plurality of transistor cells. In this embodiment, a plurality of transistor cells of the second transistor 3 are implemented in one semiconductor fin 52. In the longitudinal direction of the semiconductor fin 52, source and drain regions 53, 54 are arranged alternatingly with a source region 53 and a neighboring drain region 54 being separated by one (U-shaped) trench that accommodates the gate electrode 56. The source regions 53 are connected to the first load terminal 22, and the drain regions 54 are connected to the second load terminal 23, so that the individual transistor cells are connected in parallel. The gate electrode 56 is common to the individual transistor cells and extends along the sidewalls of the semiconductor fin 52 in the longitudinal direction. Each source region 53 and each drain region 54 (except for the source and drain regions arranged at the longitudinal ends of the semiconductor fin 52) is common to two neighboring transistor cells.

The concept of providing several transistor cells in one semiconductor fin explained with reference to FIG. 20 is, of course, also applicable to the implementation of the first semiconductor device 2.

Figure 21A:
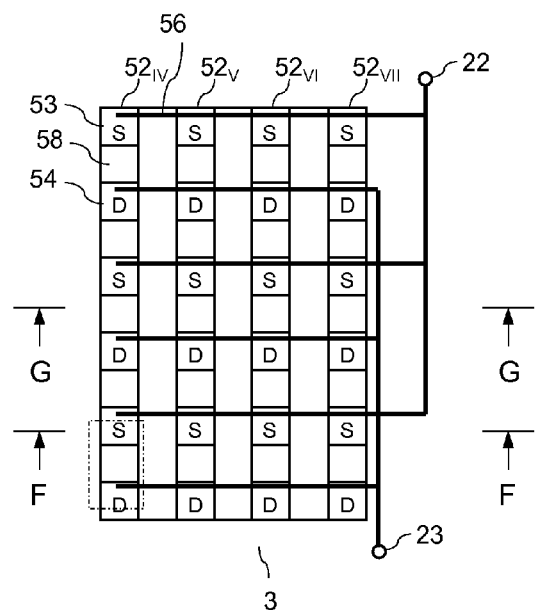
FIGS. 21A to 21C illustrates a further embodiment of one second semiconductor device including several FINFET cells connected in parallel.
Figure 21B:
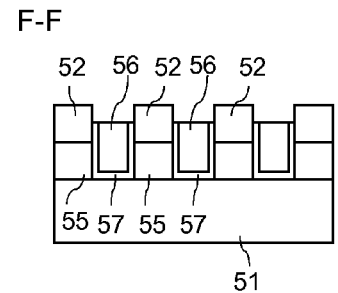
Figure 21C:
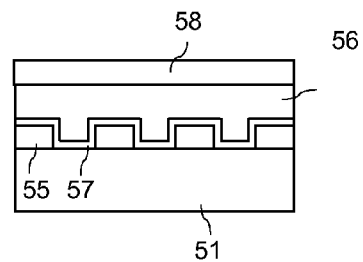

Referring to FIGS. 21A to 21C, one second transistor 3 may include a plurality of semiconductor fins $52_{IV}$, $52_{V}$, $52_{VI}$, $52_{VII}$, with each semiconductor fin $52_{IV}$-$52_{VII}$ including a plurality of transistor cells (one of these cells is highlighted by a dashed and dotted frame in FIG. 19A). FIG. 21A shows a top view of one second transistor 3, FIG. 21B shows a vertical cross sectional view in a section plane F-F cutting through source regions 53 in different fins, and FIG. 21C shows a vertical cross sectional view in a section plane G-G cutting through the trenches with the gate electrode 56 in different fins. Referring to FIG. 21A, the source regions 53 of the individual transistor cells are connected to the first load terminal 22 and the drain regions 54 of the individual transistor cells are connected to the second load terminal 23 so that the individual transistor cells are connected in parallel. These connections are only schematically illustrated in FIG. 21A.

The concept of providing a plurality of semiconductor fins with each semiconductor fin including a plurality of transistor cells explained with reference to FIGS. 21A to 21C is, of course, also applicable to the implementation of the first semiconductor device 2.

Although only 20 transistor cells are illustrated in FIG. 21A, namely five cells in each of the four semiconductor fins $52_{IV}$-$52_{VII}$, one second transistor 3 or the first semiconductor device 2 may include up to several thousand or even up to several ten or several hundred million transistor cells connected in parallel. The individual transistor cells form a matrix of transistor cells that are connected in parallel. A device (first semiconductor device 2 or second transistor 3) having a plurality of transistor cells arranged in a matrix will be referred to as matrix device in the following.

Figure 22:
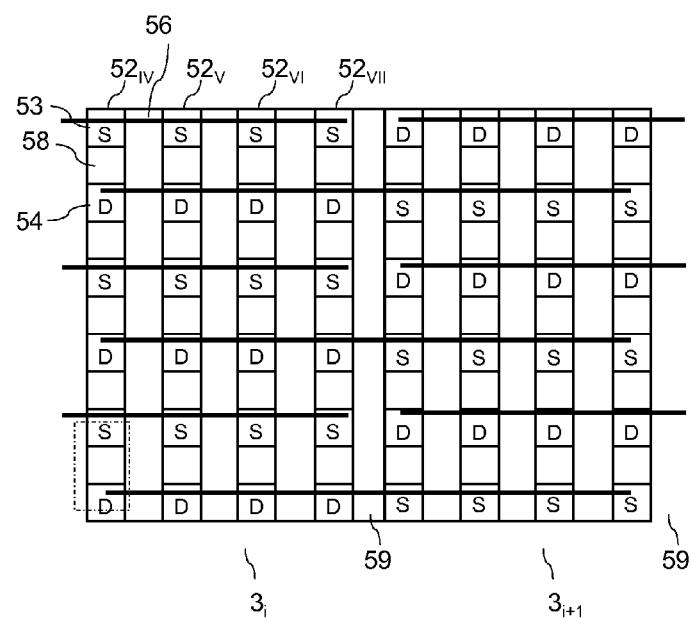
FIG. 22 illustrates two second semiconductor devices of the type illustrated in FIG. 21 connected in series.

FIG. 22 illustrates how second transistors 3 implemented as matrix devices can be connected in series. For illustration purposes, only two second transistors $3_i$, $3_{i+1}$ are shown in FIG. 22. For connecting these two transistors in series, the source regions 53 of the second transistor $3_{i+1}$ are connected to the drain regions 54 of the transistor $3_i$. The source regions 53 of the second transistor $3_i$ are connected to the drain regions 54 of second transistors $3_{i-1}$ (not illustrated), and the drain regions of the second transistor $3_{i+1}$ are connected to the source regions 53 of second transistors $3_{i+2}$ (not illustrated).

Figure 23:
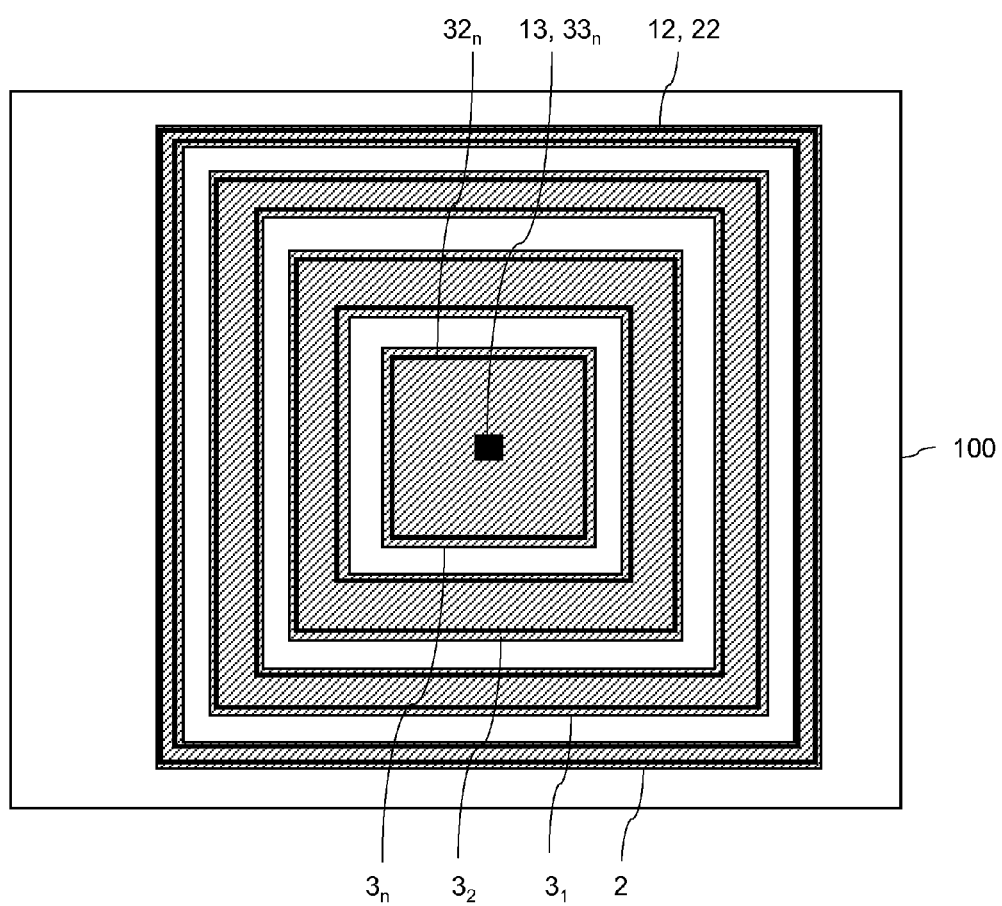
FIG. 23 illustrates a further embodiment of a semiconductor device arrangement including a first semiconductor device and a plurality of second semiconductor devices integrated in one semiconductor body.

FIG. 23 illustrates a further embodiment of a semiconductor device arrangement with a first semiconductor device 2 and with a plurality of n second semiconductor devices 3. FIG. 23 schematically illustrates a top view of a semiconductor body 100 in which active regions of the individual devices 2, 3 are implemented. For explanation purposes only it is assumed that n=3. Referring to FIG. 23, the active device region of the n-th second semiconductor device 3, is surrounded by the active device region of the second semiconductor device directly connected to the n-th second semiconductor device $3_n$, which is the second semiconductor device $3_2$ in the embodiment illustrated in FIG. 23. In general, the active device region of an arbitrary second semiconductor device 3, is surrounded by the active device region of the second semiconductor device $3_{i-1}$ directly connected to the semiconductor device $3_i$, and the 1st second semiconductor device $3_1$ is surrounded by the active device region of the first semiconductor device 2. The active device regions of the devices 2, 3, except for the n-th second semiconductor device 3, are basically ring shaped. In the illustration according to FIG. 23, these rings are rectangular rings. However, this is only an example, and any other ring geometry may be used as well.

The individual semiconductor devices can be implemented as matrix devices, so that within each of the rings illustrated in FIG. 23 a matrix device as illustrated in FIG. 2 are integrated. According to one embodiment, several matrix devices are integrated in each of the ring-shaped regions illustrated in FIG. 23, where these matrix devices within each ring are connected in parallel so as to form one of the devices 2, 3. The load terminals of the individual devices 2, 3 can also be ring shaped and are schematically illustrated as bold lines in FIG. 23. Control terminals of the individual devices 2, 3, as well as the interconnection of the individual devices 2, 3 is not illustrated in FIG. 23. For interconnecting the individual devices 2, 3 commonly known wiring and interconnection techniques can be employed.

In the semiconductor device arrangement according to FIG. 23 no additional edge termination structure is required, because in this embodiment the terminal having the highest electrical potential, namely the second load terminal 13, that is formed by the second load terminal 33, of the n-th second semiconductor device 3, is in the middle of the ring structure and is "shielded" by the other devices surrounding the n-th second semiconductor device 3. The "border" of the semiconductor device arrangement integrated in the semiconductor body 100 is formed by the active region of the first semiconductor device 2 with the first load terminal 12. The first load terminal is the terminal that has the lowest electrical potential in the semiconductor device arrangement, which may correspond to a reference potential or ground potential that is applied to the semiconductor body 100. However, this connection to reference or ground potential of the semiconductor body 100 is not explicitly illustrated in FIG. 23.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device arrangement, comprising:
   a semiconductor layer;
   at least one series circuit with a first semiconductor device and with a plurality of n second semiconductor devices, with n>1, the first semiconductor device having a load path and having active device regions integrated in the semiconductor layer, each of the second semiconductor devices having active device regions integrated in the semiconductor layer and having a load path between a first and a second load terminal and a control terminal, the second semiconductor devices having their load paths connected in series and connected in series to the load path of the first semiconductor device, each of the second semiconductor devices having its control terminal connected to one of the load terminals of another one of the second semiconductor devices or to one of the load terminals of the first semiconductor device; and
   an edge termination structure,
   wherein there is at least the load path of the another one of the second semiconductor device between the one of the load terminals of the another one of the second semiconductor devices and the second semiconductor device that has its control terminal connected to the one of the load terminals of the another one of the second semiconductor devices.

2. The semiconductor device arrangement of claim 1, wherein the first semiconductor device is a transistor.

3. The semiconductor device arrangement of claim 1, wherein the first semiconductor device is a diode.

4. The semiconductor device arrangement of claim 1,
   wherein the active device regions of the first semiconductor device and the active device regions of the second semiconductor devices are in line in the semiconductor layer in a longitudinal direction, and
   wherein the edge termination structure is adjacent the active device regions at least in directions perpendicular to the longitudinal direction.

5. The semiconductor device arrangement of claim 1, further comprising:
   two series circuits, each series circuit comprising a first semiconductor device and a plurality of n second semiconductor devices, the active device regions of the first semiconductor device and the second semiconductor devices of each series circuit being in line in the semiconductor layer and forming a longitudinal structure with a first longitudinal end where the active device regions of the first semiconductor device are located, and with a second longitudinal end where the active device regions of the second semiconductor devices are located, the longitudinal structures of the two series circuits being in line such that second longitudinal ends of the first and second longitudinal structures are adjacent.

6. The semiconductor device arrangement of claim 5, wherein the two series circuits are electrically connected in parallel.

7. The semiconductor device arrangement of claim 5, wherein the edge termination structure comprises a first partial edge termination structure adjacent the longitudinal structures in a first direction and a second partial edge termination structure adjacent the longitudinal structures in a second direction opposite the first direction.

8. The semiconductor device arrangement of claim 6, wherein at least one of the partial edge termination structures comprises:
   a first field ring associated with the first semiconductor device or one of the second semiconductor devices in one of the series circuits and associated with the corresponding semiconductor device in the other series circuit, and
   wherein the first field ring extends between the active device regions of the semiconductor devices it is associated with and connects to the first load terminals of the semiconductor devices it is associated with.

9. The semiconductor device arrangement of claim 8, wherein the first field ring is elliptical or circular in a horizontal plane of the semiconductor layer.

10. The semiconductor device arrangement of claim 8,
    wherein the semiconductor layer has a basic doping of a first doping type in a region in which the first field ring is arranged, and
    wherein the first field ring comprises a doped region of a second doping type complementary to the first doping type.

11. The semiconductor device arrangement of claim 10, further comprising:
    an electrically conductive line adjoining the first field ring and extending along the first field ring on a first surface of the semiconductor layer.

12. The semiconductor device arrangement of claim 11, further comprising:
    a second field ring of the first doping type and more highly doped than the basic doping of the semiconductor layer, the second field ring adjoining the first field ring and extending along the first field ring.

13. The semiconductor device arrangement of claim 12, wherein the first field ring and the second field ring are electrically connected through an electrically conducting line arranged above the first surface of the semiconductor layer.

14. The semiconductor device arrangement of claim 10, wherein the edge termination structure comprises a MOSFET having a source region formed by the first field ring, and further comprising:
    a drift region of the second doping type and coupled to load terminals of the second semiconductor devices of the series circuits;
    a body region of the first doping type; and
    a gate electrode adjacent the body region and dielectrically insulated from the body region by a gate dielectric.

15. The semiconductor device arrangement of claim 14, wherein the MOSFET further comprises:
    a semiconductor region of the first doping type, more highly doped than the basic doping and adjoining the drift region.

16. The semiconductor device arrangement of claim 14,
    wherein the semiconductor device the first field ring is associated with is a transistor having a control terminal, and
    wherein the gate electrode of the MOSFET is connected to the control terminal.

17. The semiconductor device arrangement of claim 8, wherein the first field ring is associated with the first semiconductor device.

18. The semiconductor device arrangement of claim 6, wherein at least one of the partial edge termination structures comprises:
- a plurality of first field rings, each associated with the first semiconductor device or one of the second semiconductor devices in one of the series circuits and associated with the corresponding semiconductor device in the other series circuit, and
- wherein each first field ring extends between the active device regions of the semiconductor devices it is associated with and connects to the first load terminals of the semiconductor devices it is associated with.

19. The semiconductor device arrangement of claim 18, wherein each of the first semiconductor device and the second semiconductor devices has an associated field ring.

20. The semiconductor device arrangement of claim 18, further comprising:
- a plurality of second field rings of the first doping type and more highly doped than the basic doping of the semiconductor layer, each second field ring associated with one first field ring, adjoining the one first field ring and extending along the one first field ring.

21. The semiconductor device arrangement of claim 20, further comprising:
- a plurality of electrically conducting lines, each conducting line electrically connecting one first field ring and the associated second field ring.

22. The semiconductor device arrangement of claim 1, wherein the second semiconductor devices are MOSFETs, each MOSFET having a source terminal as a first load terminal, a drain terminal as a second load terminal, and a gate terminal as a control terminal.

23. The semiconductor device arrangement of claim 22, wherein the second semiconductor devices are FINFETs.

24. The semiconductor device arrangement of claim 1, wherein the semiconductor layer is part of a semiconductor body or forms a semiconductor body.

25. The semiconductor device arrangement of claim 1, wherein the semiconductor layer is part of an SOI substrate.

26. A semiconductor device arrangement, comprising:
- a semiconductor layer;
- at least one series circuit with a first semiconductor device and with a plurality of n second semiconductor devices, with n>1, the first semiconductor device having a load path and having active device regions integrated in the semiconductor layer, each of the second semiconductor devices having active device regions integrated in the semiconductor layer and having a load path between a first and a second load terminal and a control terminal, the second semiconductor devices having their load paths connected in series and connected in series to the load path of the first semiconductor device, each of the second semiconductor devices having its control terminal connected to one of the load terminals of another one of the second semiconductor devices or to one of the load terminals of the first semiconductor device, and
- wherein the active device region of the first semiconductor device surrounds the active device regions of the second semiconductor devices in a horizontal plane of the semiconductor layer.

27. The semiconductor device arrangement of claim 26, wherein each of n−1 second semiconductor devices has an active device region adjacent the active device region of another second semiconductor device and surrounding the active device region of the other second semiconductor device.

28. The semiconductor device arrangement of claim 26, wherein there is at least the load path of the another one of the second semiconductor device between the one of the load terminals of the another one of the second semiconductor devices and the second semiconductor device that has its control terminal connected to the one of the load terminals of the another one of the second semiconductor devices.

* * * * *